US008455935B2

(12) United States Patent
Ishida et al.

(10) Patent No.: US 8,455,935 B2
(45) Date of Patent: Jun. 4, 2013

(54) FERROELECTRIC POLYMER

(75) Inventors: Takehisa Ishida, Tokyo (JP); Sunil Madhukar Bhangale, Chao Chu Kang (SG); Han Hong, Jurong Island (SG); Christina Li Lin Chai, Jurong Island (SG)

(73) Assignees: Sony Corporation, Tokyo (JP); Agency for Science, Technology, and Research, Tokyo (JP)

( * ) Notice: Subject to any disclaimer, the term of this patent is extended or adjusted under 35 U.S.C. 154(b) by 262 days.

(21) Appl. No.: 12/474,987

(22) Filed: May 29, 2009

(65) Prior Publication Data

US 2009/0294818 A1    Dec. 3, 2009

(30) Foreign Application Priority Data

May 30, 2008  (SG) ............... 200804448-9

(51) Int. Cl.
*H01L 21/02*    (2006.01)
(52) U.S. Cl.
USPC  257/295; 438/3; 257/E21.436; 257/E21.664; 257/E27.104; 257/E29.272
(58) Field of Classification Search
USPC ............ 257/295, 528, 532, E51.007, E51.01, 257/E51.011, E51.031, E27.07, E27.081, 257/E27.084, E21.436, E21.663, E21.664, 257/495, E27.104, E29.164, E29.272, E21.208, 257/E29.104; 438/3; 528/7
See application file for complete search history.

(56) References Cited

U.S. PATENT DOCUMENTS

| | | | | |
|---|---|---|---|---|
| 5,666,305 | A  * | 9/1997 | Mihara et al. | 365/145 |
| 6,498,744 | B2 * | 12/2002 | Gudesen et al. | 365/145 |
| 7,126,176 | B2 * | 10/2006 | Gudesen et al. | 257/295 |
| 2004/0002176 | A1 | 1/2004 | Xu | |
| 2006/0249769 | A1 * | 11/2006 | Eder et al. | 257/296 |
| 2009/0263671 | A1 * | 10/2009 | Yao et al. | 428/457 |
| 2009/0285981 | A1 * | 11/2009 | Dyreklev et al. | 427/131 |
| 2009/0294817 | A1 * | 12/2009 | Ishida | 257/295 |
| 2010/0215836 | A1 * | 8/2010 | Park | 427/58 |

OTHER PUBLICATIONS

Bernholc et al., "Understanding and Enhancing Polarization in Complex Materials", Computing in Science & Engineering, Nov./Dec. 2004, pp. 12-21.
Bernholc et al., "Large-Scale Quantum-Mechanical Stimulations of Nanoscale Devices and New Materials", IEEE Computer Society, Proceedings of the Users Group Conference, 2004.
Search Report and Written Opinion dated Jul. 15, 2010, corresponding to Singapore Appln. No. 20804448-9.
Written Opinion dated Jul. 7, 2011 referencing Singapore Patent Application No. 200804448-9.
"Thermal Stability and Molecular Weight of Two New Boron-Nitrogen Polymers" Journal of Applied Polymer Science vol. 21, pp. 1561-1567 (1977).
Intellectual Property Office of Singapore, Search and Examination Report, issued in connection with Singapore Patent Application Serial No. 200804448-9, dated Jan. 26, 2012. (8 pages).

* cited by examiner

*Primary Examiner* — Matthew Landau
*Assistant Examiner* — Joseph C Nicely
(74) *Attorney, Agent, or Firm* — K&L Gates LLP

(57) ABSTRACT

A ferroelectric film comprising polyaminodifluoroborane (PADFB). Also a memory device utilizing the ferroelectric film, a method of fabricating a ferroelectric polymer and a ferroelectric solution.

17 Claims, 3 Drawing Sheets

FERROELECTRIC POLYMER

CROSS REFERENCES TO RELATED APPLICATIONS

The present application claims priority to Singapore Priority Patent Application 200804448-9 filed in the Singapore Patent Office on May 30, 2008, the entire content of which is hereby incorporated by reference.

BACKGROUND

The present application relates to a ferroelectric polymeric film and a method of fabricating a ferroelectric polymer.

Ferroelectric polymers are promising materials for electronic devices. For example, they are suitable for a non-volatile memory. Since a thin film can be easily formed from a solution by means of a simple process such as spin-coating, die-coating, screen-printing or the other coating processes, the production cost of the devices utilizing a ferroelectric polymer is expected to be extremely cheap. However, remanence, which is the maximum spontaneous polarization when no external electric field is applied, of an organic material is generally lower than that of an inorganic ferroelectric material. Remanence is one of most important properties for a ferroelectric material. When a ferroelectric material is used for a memory device, the magnitude of the output signal is proportional to its remanence. So there exists a strong demand of a ferroelectric material which has an improved remanence.

SUMMARY

In an embodiment a ferroelectric polymer comprising Polyaminodifluoroborane (PADFB) is provided. This may have the advantage of increased remanence.

In another embodiment, a ferroelectric film comprising PADFB is provided.

In a further embodiment, a method of fabricating a ferroelectric polymer is provided including mixing a predetermined amount of PADFB with a solvent.

In yet another embodiment, a ferroelectric solution is provided including PADFB and a solvent.

Additional features and advantages of the present application are described in, and will be apparent from, the following Detailed Description and the figures.

Additional features and advantages of the present invention are described in, and will be apparent from, the following Detailed Description and the figures.

DETAILED DESCRIPTION

The present application will be described below in greater detail with reference to the drawings according to an embodiment.

Figure 1:
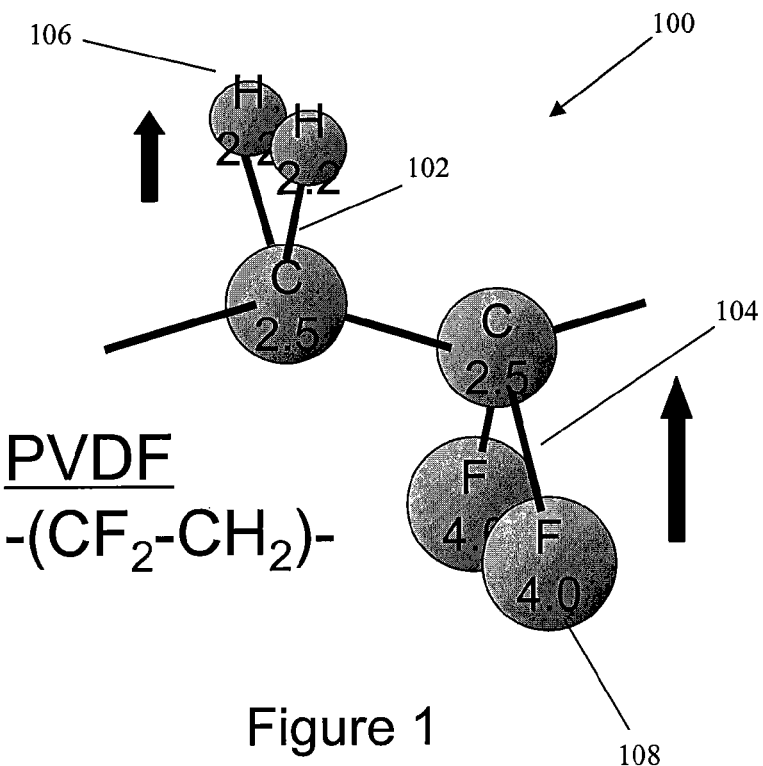
FIG. 1 is a molecular structure of PVDF.

An example of a ferroelectric polymer is shown in FIG. 1. The polyvinylidenefluoride (PVDF) molecule 100 includes H—C bonds 102 and F—C bonds 104. Ferroelectric properties of polymers may be related to the dipole moment induced between the hydrogen 106 and fluorine 108 atoms. This is also related to the polarity of the molecule.

A way to measure the dipole moment is by comparing the electronegativeness of the atoms within the molecule. The electronegativeness relates to the ability of an atom to attract electrons (or electron density) towards itself in a covalent bond. Since the electronegativeness of fluorine atom is 4.0 and that of carbon is 2.5, the fluorine atom tends to be charged more negatively than the carbon atom in a F—C bond. On the other hand, hydrogen atom has only 2.2 in electronegativeness. Therefore, the carbon atom tends to be charged more negatively than the hydrogen atom in an H—C bond. These properties induce imbalance of electron distribution, which leads to a strong dipole moment between the hydrogen and the fluorine atoms.

Figure 2:
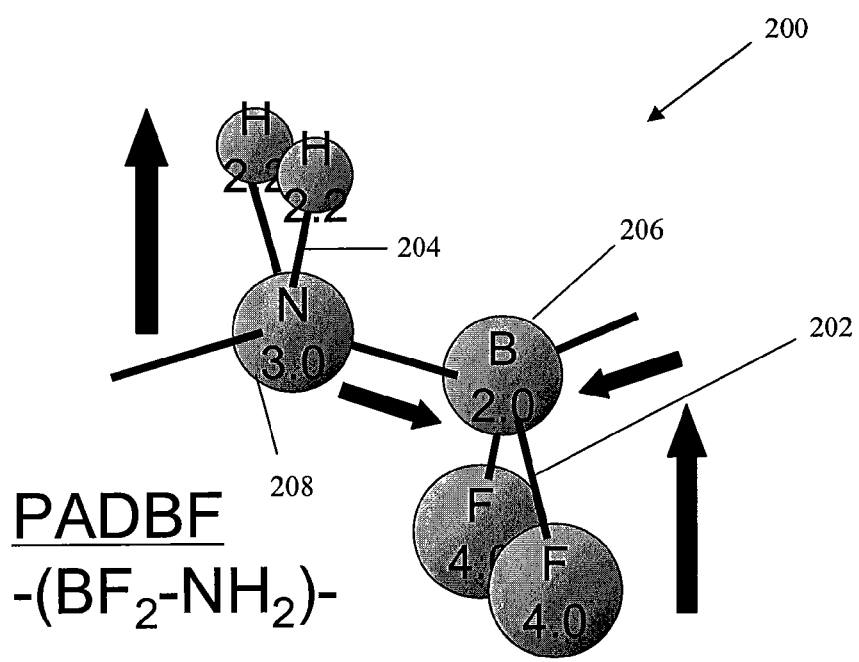
FIG. 2 is a molecular structure of PADBF.

A further example of a ferroelectric polymer is shown in FIG. 2. The polyaminodifluoroborane (PADFB) molecule 200 includes B—F bonds 202 and N—H bonds 204. The electronegativeness of boron 206 is 2.0 and nitrogen 208 is 3.0, and therefore PADFB may have a dipole moment twice as large as PVDF due to the large differences of electronegativeness in both B—F 202 and N—H 204 bonds. A larger dipole moment may have the advantage of higher remanence, since remanence is proportional to the maximum dipole moment obtained when no external electric field is applied.

PADFB may be synthesised by pyrolysis of precursor $(BF_3NH_3)$ and collected by a cold trap. Collected PADFB may be dissolved in dimethylformamide (DMF) and spin-coated onto a glass substrate.

Since PADFB is a hygroscopic and brittle material, it may be difficult to obtain a continuous and air-stable film. It may be desirable to provide a ferroelectric polymer with improved phase separation, low hygroscopicity and/or improved film stability in air while still obtaining high remanence.

Certain ferroelectric polymers have improved film uniformity and stability. For example ferroelectric polymers such as P(VDF/TrFE), PVDF or Nylon11 may be more air stable and less hygroscopic than PADFB. According to an embodiment, PADFB may be mixed with another material, for example a different ferroelectric polymer, to improve film uniformity and stability.

Figure 3:
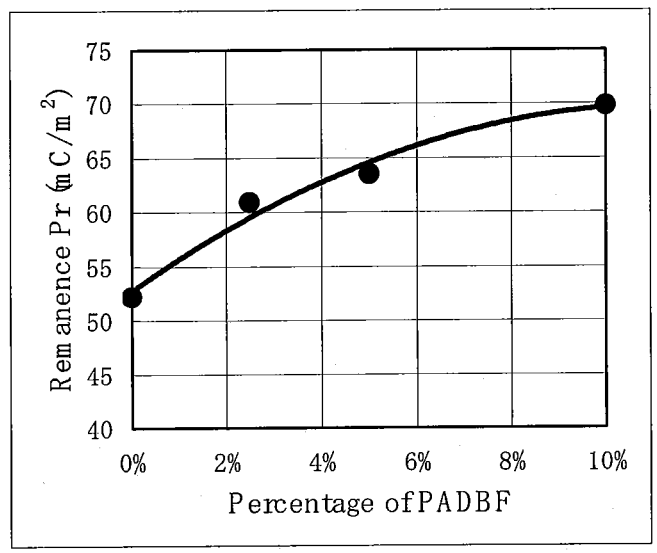
FIG. 3 is the relationship between remanence and concentration of PADFB.

FIG. 3 shows the remanence for a range of mixtures of P(VDF/TrFE) and PADFB. This shows that remanence increases when the concentration of PADFB is higher, since PADFB has higher remanence compared to P(VDF/TrFE). As shown in FIG. 3, remanence tends to saturate between 10% and 20% in concentration of PADBF.

At least up until a concentration of 20%, most of PADFB molecules are surrounded by air-stable P(VDF/TrFE) molecules. Within this range the film was quite stable in air and significant absorption of water wasn't observed. A similar effect was observed when PADFB was mixed with various ferroelectric polymers such as PVDF or Nylon11.

A mixture of PADFB and P(VDF/TrFE) may be produced by dissolving 8 wt % of Dehydrated P(VDF/TrFE) pellets in dehydrated DMF in a glove box filled with nitrogen gas, then dissolving 0.8 wt % of PADFB, in the solution. The solution may be an intermediate product. The solution can then be spin-coated on a glass substrate in the glove box to avoid absorption of water and annealed at 150° C. for 3 hours. Alternatively for mass production a roll-to-roll process could be used where fabrication takes place on a running sheet-like substrate between two rolls of the sheet. For example, a 10% PADFB concentration film produced as described above exhibits good remanence.

Figure 4A:
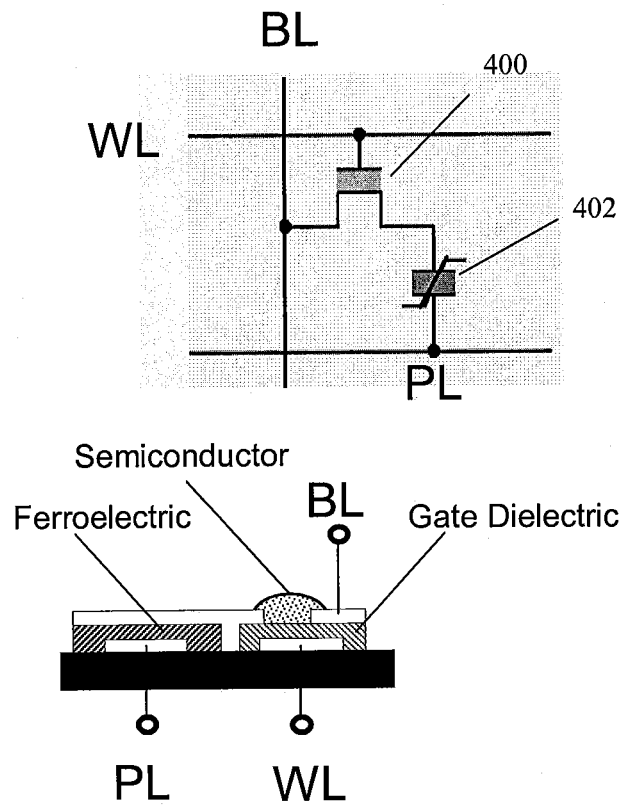
FIG. 4(a) is a device structure of 1T1C-type memory.
Figure 4B:
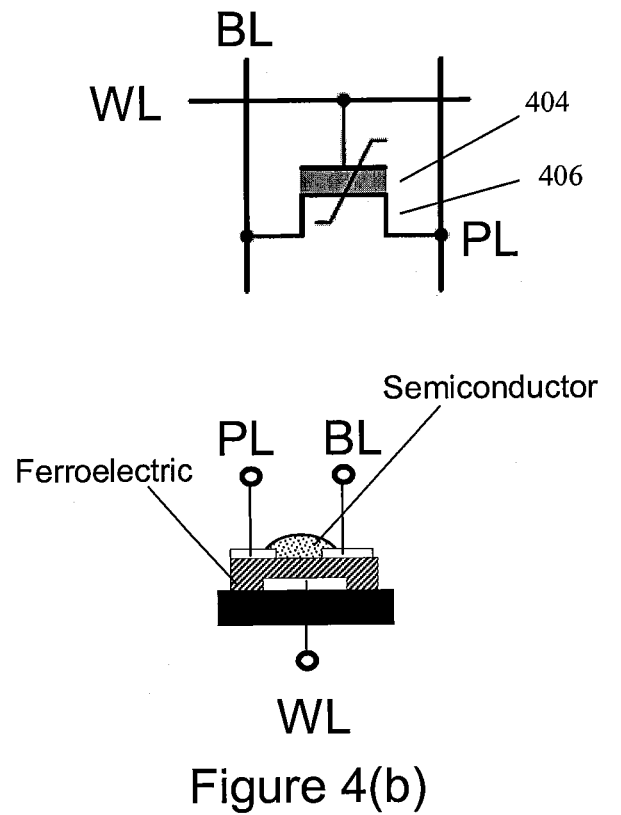
FIG. 4(b) is a device structure of 1T-type memory.
Figure 4C:
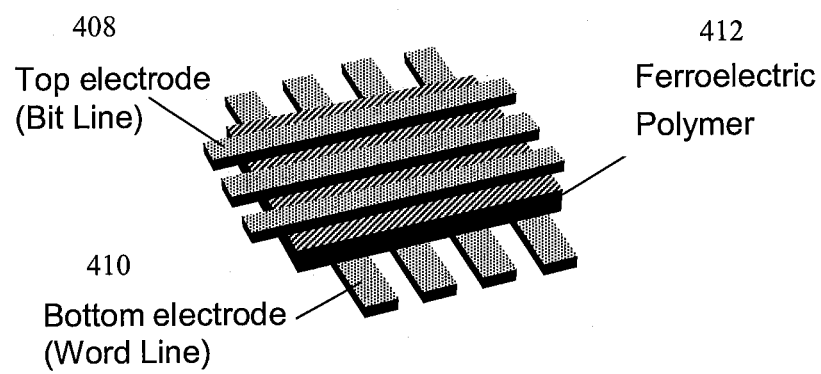
FIG. 4(c) is a device structure of cross point type memory.

Using a high remanence ferroelectric polymer in memory devices may allow the device to be smaller or more information can be stored in the same area. FIGS. 4(a)-4(c) illustrate various structures of memory devices. The structure shown in FIG. 4(a) is called 1T1C type which consists of a transistor 400 and a capacitor 402 having a ferroelectric polymer according to the exemplary embodiment as the dielectric. To write information in this memory cell, an electric field higher than the coerciveness of the ferroelectric material is applied between BL and PL while the transistor 400 is turned on by applying voltage to WL for example 1.5 V which is sufficiently larger than the threshold level of the transistor. Depending on the polarity of the electric field between BL and PL, either data "0" or data "1" is stored in the ferroelectric layer. In a reading operation, a certain polarity of electric field is applied between BL and PL while the appropriate voltage is applied to WL. If the stored polarization reverses, a displacement current flows between BL and PL. On the other hand, if no polarization reversal is induced, no displacement current flows between BL and PL. Therefore, by detecting the displacement current, the stored information can be determined as having "0" or "1".

FIG. 4(b) is a schematic of 1T type memory cell. The writing operation for the 1T type memory cell is the same as for the 1T1C type. An electric field higher than the coerciveness of the ferroelectric material 404 according to an embodiment is applied between BL and PL while the transistor 406 is turned on by applying an appropriate voltage to WL. To read the stored information in the cell, voltage is applied to WL for example 1.5 V while a certain magnitude of electric field smaller than the coerciveness is applied between BL and PL. Since the current flow between BL and PL differs depending on the direction of the stored polarization, the stored information can be determined as having "0" or "1".

FIG. 4(c) shows a structure of so-called cross point type memory. It includes top electrodes 408, bottom electrodes 410 and a ferroelectric layer 412 according to an embodiment. Top 408 and bottom 410 electrodes form a matrix and the ferroelectric layer 412 is sandwiched by these electrodes. When a pair of top 408 and bottom 410 electrodes is selected and a voltage is applied between them for example 30 V, an electric field exceeding coerciveness is induced at the corresponding cross point. Thus, writing or reading operation is executed following the same principle as 1T1C.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A ferroelectric film, comprising:
polyaminodifluoroborane (PADFB); and
a ferroelectric polymer mixed with the PADFB, the ferroelectric polymer being different from PADFB,
wherein the concentration of the PADFB ranges from 2 wt % to 20 wt %,
wherein the ferroelectric film is air-stable and has a uniform structure, and
wherein the PADFB has a larger dipole moment than polyvinylidene fluoride (PVDF).

2. The ferroelectric film as claimed in claim 1 wherein the ferroelectric polymer is selected from the group consisting of Polyvinylidenefluoride (PVDF), copolymer of Polyvinylidenefluoride and Trifluoroethylene (P(VDF/TrFE)) and Polyundecanoamide (Nylon11).

3. The ferroelectric film as claimed in claim 1, wherein the ferroelectric film is less hygroscopic than the PADFB.

4. The ferroelectric film as claimed in claim 1, wherein the ferroelectric film has a higher remanence than the ferroelectric polymer.

5. The ferroelectric film as claimed in claim 1, wherein the ferroelectric film has an air stability that is greater than the PADFB.

6. The ferroelectric film as claimed in claim 1, wherein the ferroelectric film is formed by spin-coating a solution containing PADFB and the ferroelectric polymer onto a substrate.

7. The ferroelectric film as claimed in claim 1, wherein the PADFB has a dipole moment up to twice as large as that of PVDF.

8. The ferroelectric film as claimed in claim 1, wherein the concentration of the PADFB ranges from 2 wt % to 10 wt %.

9. The ferroelectric film as claimed in claim 8, wherein the ferroelectric polymer is a copolymer of Polyvinylidenefluoride and Trifluoroethylene (P(VDF/TrFE)).

10. A memory device, comprising:
one or more memory cells, each memory cell comprising a pair of electrodes, and
a ferroelectric film being located between the electrodes
wherein the ferroelectric film includes
polyaminodifluoroborane (PADFB), and
a ferroelectric polymer mixed with the PADFB, the ferroelectric polymer being different from PADFB,
wherein the concentration of the PADFB ranges from 2 wt % to 20 wt %,
wherein the ferroelectric film is air-stable and has a uniform structure, and
wherein the PADFB has a larger dipole moment than polyvinylidene fluoride (PVDF).

11. The memory device as claimed in claim 10 wherein the ferroelectric polymer is selected from the group consisting of Polyvinylidenefluoride (PVDF), copolymer of Polyvinylidenefluoride and Trifluoroethylene (P(VDF/TrFE)) and Polyundecanoamide (Nylon11).

12. The memory device as claimed in claim 10 further comprising a switching transistor configured to apply a voltage to one of the electrodes.

13. A memory device, comprising:
one or more field effect transistors (FET), each transistor having a gate insulator made of a ferroelectric film including
polyaminodifluoroborane (PADFB), and
a ferroelectric polymer mixed with the PADFB, the ferroelectric polymer being different from PADFB,
wherein the concentration of the PADFB ranges from 2 wt % to 20 wt %,
wherein the ferroelectric film is air-stable and has a uniform structure, and
wherein the PADFB has a larger dipole moment than polyvinylidene fluoride (PVDF).

14. The memory device as claimed in claim 13 wherein the ferroelectric polymer is selected from the group consisting of Polyvinylidenefluoride (PVDF), copolymer of Polyvinylidenefluoride and Trifluoroethylene (P(VDF/TrFE)) and Polyundecanoamide (Nylon11).

15. A method of fabricating a ferroelectric polymer comprising:
mixing a predetermined amount of polyaminodifluoroborane (PADFB) and a ferroelectric polymer with a solvent thereby forming a ferroelectric solution, the ferroelectric polymer being different from PADFB; and forming a film with the ferroelectric solution, wherein the concentration of the PADFB ranges from 2 wt % to 20 wt %, and wherein the PADFB has a larger dipole moment than polyvinylidene fluoride (PVDF).

16. The method as claimed in claim 15, further comprising annealing the film.

17. A ferroelectric solution comprising:

polyaminodifluoroborane (PADFB);

a ferroelectric polymer mixed with the PADFB, the ferroelectric polymer being different from PADFB; and a solvent, wherein the concentration of the PADFB ranges from 2 wt % to 20 wt %, and wherein the PADFB has a larger dipole moment than polyvinylidene fluoride (PVDF).

* * * * *